US010151792B2

(12) United States Patent
Nakamura et al.

(10) Patent No.: US 10,151,792 B2
(45) Date of Patent: *Dec. 11, 2018

(54) MANUFACTURING METHOD AND PROGRAM OF SEMICONDUCTOR DEVICE

(71) Applicant: Renesas Electronics Corporation, Tokyo (JP)

(72) Inventors: Yoshiyuki Nakamura, Tokyo (JP); Tomoaki Tamura, Tokyo (JP); Kouichi Kumaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/934,664

(22) Filed: Mar. 23, 2018

(65) Prior Publication Data

US 2018/0217203 A1 Aug. 2, 2018

Related U.S. Application Data

(63) Continuation of application No. 14/735,001, filed on Jun. 9, 2015, now Pat. No. 9,945,902.

(30) Foreign Application Priority Data

Jun. 20, 2014 (JP) .................................. 2014-127157

(51) Int. Cl.
G01R 31/28 (2006.01)
H01L 21/66 (2006.01)
H01L 23/00 (2006.01)

(52) U.S. Cl.
CPC ..... *G01R 31/2855* (2013.01); *G01R 31/2894* (2013.01); *H01L 22/14* (2013.01); *H01L 22/20* (2013.01); *H01L 24/95* (2013.01)

(58) Field of Classification Search
CPC . G01R 31/2855; G01R 31/2894; H01L 22/14; H01L 22/20; H01L 24/95
See application file for complete search history.

(56) References Cited

U.S. PATENT DOCUMENTS 5,519,333 A 5/1996 Righter
5,829,128 A 11/1998 Eldridge
(Continued)

FOREIGN PATENT DOCUMENTS

JP 2001-004699 A 1/2001
JP 2008-002900 A 1/2008
(Continued)

OTHER PUBLICATIONS

A.Nahar, R.Daasch, S.Subramaniam, "Burn-In Reduction Using Principal Component Analysis", IEEE International Test Conference 2005.
(Continued)

*Primary Examiner* — Bilkis Jahan
*Assistant Examiner* — Victor Barzykin
(74) *Attorney, Agent, or Firm* — McGinn IP Law Group, PLLC

(57) ABSTRACT

A semiconductor device manufacturing method includes forming a plurality of semiconductor chips on a main surface of a semiconductor wafer, electrically testing each of the semiconductor chips, dicing the semiconductor wafer into individual semiconductor chips and assembling each of the semiconductor chips into a package to be a semiconductor device, subjecting the packages to a burn-in test, determining whether each of the semiconductor chips requires the burn-in test to be performed, and generating a determination model for determining whether the semiconductor chips require the burn-in test to be performed.

8 Claims, 8 Drawing Sheets

(56) References Cited

U.S. PATENT DOCUMENTS

| | | | |
|---|---|---|---|
| 5,907,492 | A | 5/1999 | Akram |
| 6,400,173 | B1 | 6/2002 | Shimizu |
| 7,120,513 | B1 | 10/2006 | Akram |
| 7,340,359 | B2 | 3/2008 | Erez et al. |
| 8,417,477 | B2 | 4/2013 | Miguelanez |
| 2008/0262793 | A1 | 10/2008 | Subramaniam |
| 2011/0024911 | A1 | 2/2011 | Shibuya |

FOREIGN PATENT DOCUMENTS

| | | |
|---|---|---|
| JP | 2008-010477 A | 1/2008 |
| JP | 2008-544213 A | 12/2008 |

OTHER PUBLICATIONS

N.Sumikawa, L.-C.Wang, M.S.Abadir, "An Experiment of Burn-In Time Reduction Based on Parametric Test Analysis", IEEE International Test Conference 2012.

Japanese Office Action dated Jul. 25, 2017, with an English translation.

FIG. 5A
LEAK CURRENT TEST t11

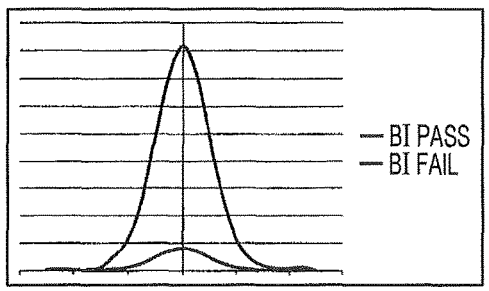

$x^2 = 3.7 \rightarrow$ VALUE SMALL $\rightarrow$ NOT ADOPTED

FIG. 5B
RESET CURRENT TEST t21

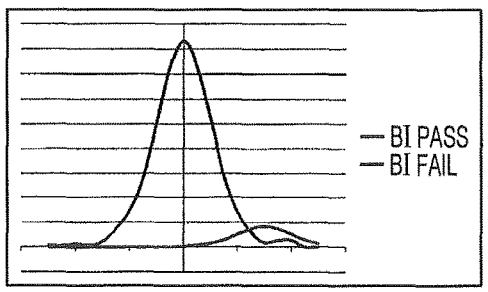

$x^2 = 14807 \rightarrow$ VALUE LARGE $\rightarrow$ ADOPTED

FIG. 5C
IDDQ CURRENT TEST t31

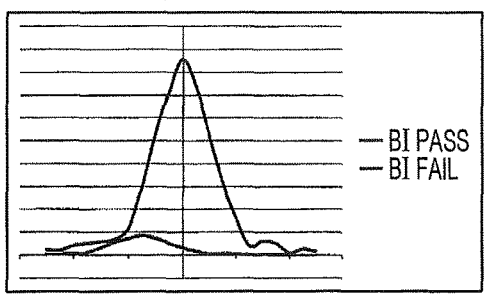

$x^2 = 3002 \rightarrow$ VALUE LARGE $\rightarrow$ ADOPTED

FIG. 5D
VOLTAGE TEST t41

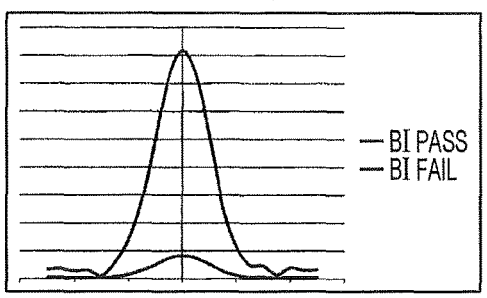

$x^2 = 8.9 \rightarrow$ VALUE SMALL $\rightarrow$ NOT ADOPTED

FIG. 5E
FREQUENCY TEST t51

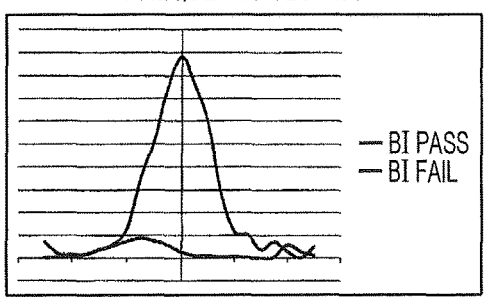

$x^2 = 4075 \rightarrow$ VALUE LARGE $\rightarrow$ ADOPTED

FIG. 5F
LEAK CURRENT TEST t12

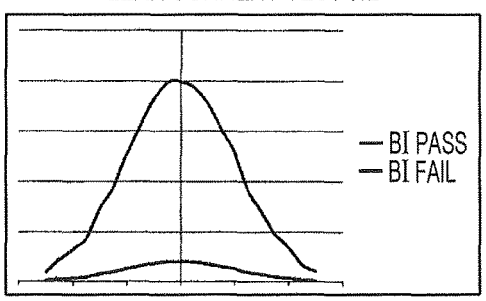

$x^2 = 18.9 \rightarrow$ VALUE SMALL $\rightarrow$ NOT ADOPTED

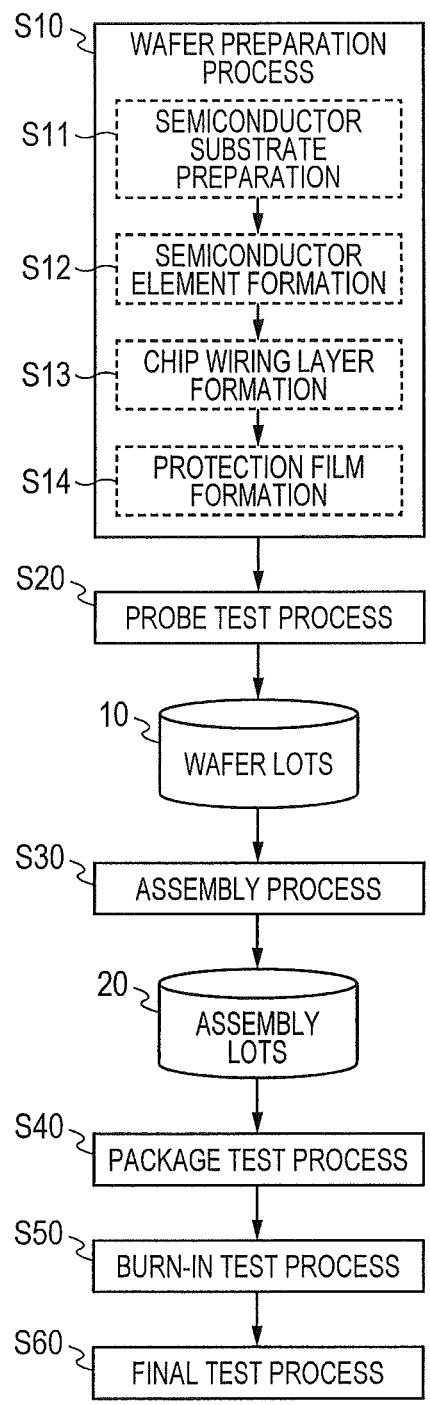

MANUFACTURING METHOD AND PROGRAM OF SEMICONDUCTOR DEVICE

This Application is a Continuation Application of U.S. patent application Ser. No. 14/735,001, which was filed on Jun. 9, 2015, and the disclosure of which is incorporated herein in its entirety by reference thereto.

CROSS-REFERENCE TO RELATED APPLICATIONS

The disclosure of Japanese Patent Application No. 2014-127157 filed on Jun. 20, 2014 including the specification, drawings and abstract is incorporated herein by reference in its entirety.

BACKGROUND

The present invention relates to a semiconductor device manufacturing method and, more particularly, to a semiconductor device manufacturing method including a burn-in test process and a technique effectively applicable to a program used to perform the manufacturing method.

A semiconductor device manufacturing process includes a test process in which a burn-in (hereinafter also referred to as "BI") test (acceleration test) is performed. In a burn-in test, each semiconductor device is, for example, subjected to a high temperature and a high voltage for a predetermined amount of time for the purpose of removing semiconductor devices likely to develop initial failure.

In Published Japanese Translation of a PCT Application No. 2008-544213 (patent literature 1), a technique is disclosed in which, based on some information, the chips formed on a semiconductor wafer are sorted into two groups, and the chips in one of the two groups are subjected to a long stress test and the chips in the other group are subjected to a short stress test. In the technique disclosed in A. Nahar, R. Daasch, S. Subramaniam, "Burn-In Reduction Using Principal Component Analysis," IEEE International Test Conference 2005 (non-patent literature 1), an optimum time length of a burn-in test is determined by making principal component analysis based on past burn-in test results and forecasting a fail time. Also, in the technique disclosed in N. Sumikawa, L.-C. Wang, M. S. Abadir, "An Experiment of Burn-In Time Reduction Based On Parametric Test Analysis," IEEE International Test Conference 2012 (non-patent literature 2), by analyzing results of a short burn-in test, whether an additional burn-in test is required is determined for each lot.

SUMMARY

Performing a burn-in test takes a long time, and the cost of a burn-in test accounts for a large portion of the total test cost. Hence, there is strong demand for reduction in the cost of burn-in tests.

In this regard, the technique disclosed in the patent literature 1 makes it possible to improve efficiency of a stress test by appropriately adjusting the stress test time, but the stress test itself is a must and cannot be omitted. Also, in the patent literature 1, no particular technique is described as to how to sort the chips formed on a wafer into two groups. Similarly, in the technique disclosed in the non-patent literature 1, also, the burn-in time is optimized, but the burn-in itself cannot be omitted. Furthermore, in the technique disclosed in the non-patent literature 2, also, execution of a short burn-in test is necessary.

Thus, according to the techniques disclosed in the patent literature 1, non-patent literature 1, and non-patent literature 2, the burn-in test cannot be omitted as unnecessary.

Other problems to be addressed and novel features of the present invention will become apparent from the description of this specification and attached drawings.

A typical embodiment of the present invention includes a process in which whether each semiconductor chip requires a burn-in test to be performed is determined based on measurement data obtained in a probe test process. In an assembly process, packages each assembled with a semiconductor chip are sorted, based on the results of determination made in the process for determining whether a burn-in test is required, into a first lot which includes packages each including a semiconductor chip determined to require a burn-in test to be performed and a second lot which includes packages each including a semiconductor chip determined to require no burn-in test to be performed. In a burn-in test process, only the packages included in the first lot are subjected to a burn-in test.

According to the typical embodiment of the present invention, a burn-in test process can be omitted for some or all lots.

BRIEF DESCRIPTION OF THE DRAWINGS

FIGS. 5A to 5F are diagrams showing example calculations of association degrees between test items for a probe test and results of a burn-in test both performed according to the first embodiment.

FIG. 8 is a process flow chart outlining an example of an existing semiconductor device manufacturing method.

DETAILED DESCRIPTION

Figure 1:
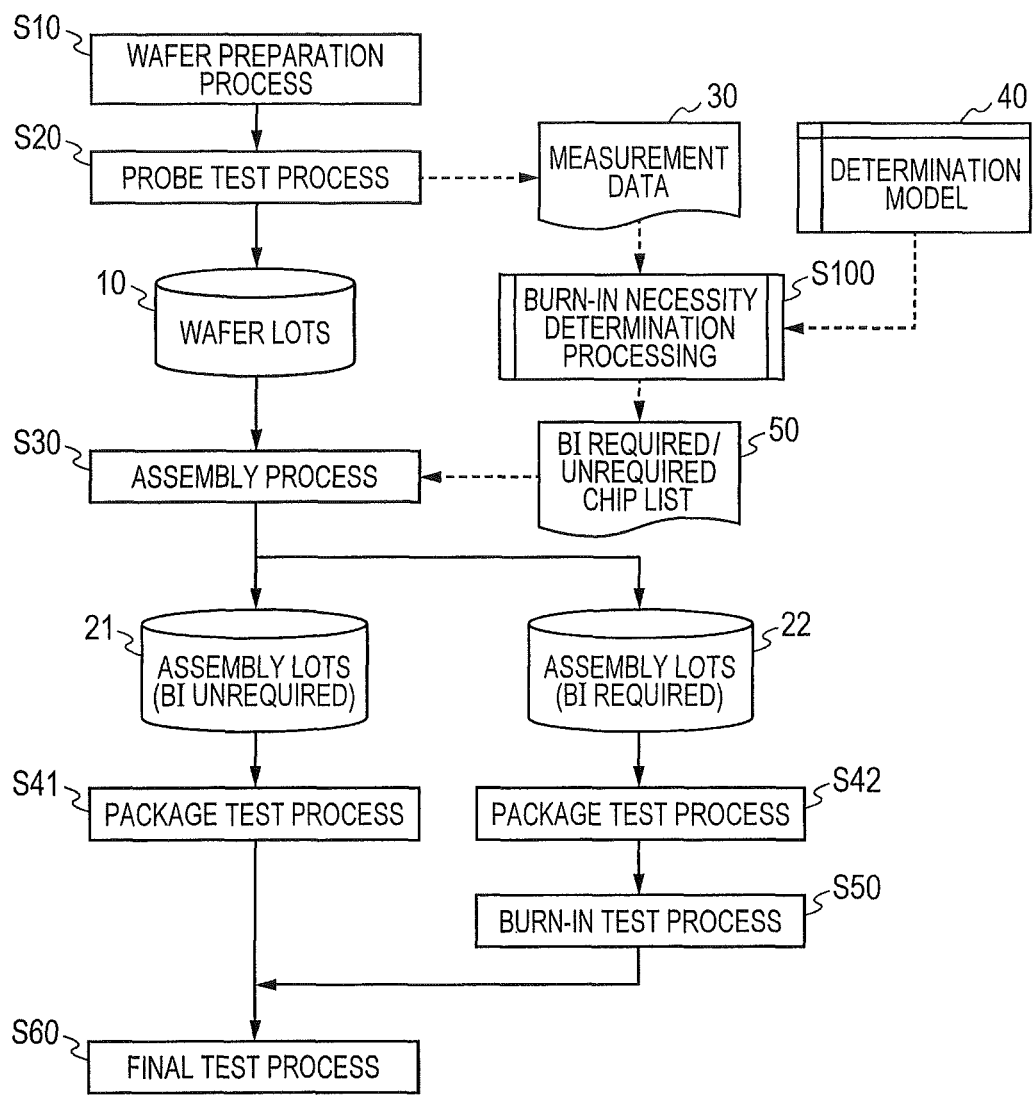
FIG. 1 is a process flow chart outlining an example of a semiconductor device manufacturing method according to a first embodiment of the present invention.

Embodiments of the present invention will be described below with reference to drawings. Unless otherwise noted, like reference numerals denote like parts throughout the attached drawings and their description will not be repeated.

Semiconductor Device Manufacturing Method

FIG. 8 is a process flow chart outlining an example of an existing semiconductor device manufacturing method. In a wafer preparation process (S10) performed as a front-end process, a semiconductor wafer (hereinafter also referred to simply as a "wafer") is prepared. The wafer is, for example, approximately circular as seen from above, not shown, and has plural chip areas arranged on the main surface (device formation surface) thereof.

As shown in FIG. 8, in the wafer preparation process (S10), first, in a semiconductor substrate preparation step (S11), a semiconductor substrate having a main surface is prepared. Subsequently, in a semiconductor element formation step (S12), plural semiconductor elements such as transistors and diodes are formed over the main surface of the semiconductor substrate. Subsequently, in a chip wiring layer formation step (S13), wiring layers are stacked over the main surface of the semiconductor substrate. The plural semiconductor elements formed over the main surface of the semiconductor substrate are electrically coupled via the plural wirings formed in the wiring layers, thereby forming plural semiconductor integrated circuits over the main surface side of the wafer. Subsequently, in a protection film formation step (S14), protection films (e.g., passivation film and insulation film) are formed to cover the wiring layers. Through these steps, a wafer is obtained which includes plural chip areas each including an integrated circuit equivalent to a semiconductor chip (hereinafter also referred to simply as a "chip").

After completion of the wafer preparation process (S10), in a probe test (wafer test) process (S20), the chips formed over the wafer are electrically tested using, for example, a probe card and a probe inspection device. Information about wafers determined non-defective in the probe test process (S20) is managed in wafer lots 10 on a lot basis. The wafer lots 10 may be configured with, for example, a data store such as a database or a file.

Subsequently, in an assembly process (S30) performed as a back-end process, the wafer is diced into individual chip areas, thereby generating plural chips, and the chips determined to be non-defective in the probe test process (S20) are assembled to packages as semiconductor devices. The package information obtained through the assembly process (S30) is managed in assembly lots 20 on a lot basis. The assembly lots 20 may be configured with, like the wafer lots 10, a data store such as a database or a file.

Subsequently, packaged chips (packaged products) are tested to detect assembly defects as required. This is done in a package test process (S40) in which the packages are electrically tested using a testing device, for example, a package probe (semiconductor inspection device). Furthermore, in a burn-in test process (S50), packages determined non-defective in the package test process (S40) are tested under accelerated stress conditions with high temperature and high voltage applied to the packages. This is to detect and remove initially defective packages which, even if functioning normal at the time of testing, may fail after a certain period of time.

Subsequently, in a final test process (S60), the packages determined non-defective in the burn-in test process (S50) are tested in detail using, for example, a testing device as to their functions and electric characteristics. The packages determined non-defective in the final test process (S60) are shipped to the market. Note that the above process flow only outlines main processes for chip manufacture and that the processes can be modified in various ways.

Of the test processes included in the above manufacturing process flowchart, the burn-in test process (S50) accounts for a particularly large portion of the total cost of testing as also stated in the foregoing. Therefore, a cost reduction achieved by improving the efficiency of the burn-in test process (S50) has a great effect on reducing the total cost. As stated in the foregoing, however, while the burn-in time can be reduced using existing techniques, the existing techniques cannot eliminate the necessity of performing a burn-in test.

In the semiconductor device manufacturing method according to the following embodiments of the present invention, based on the measurement results obtained in the probe test process (S20) performed as a front-end process, necessity of the burn-in test process (S50) (whether or not the process is omissible) is determined for individual packages, and the burn-in test process (S50) is omitted for some or all of the packages determined not to require the burn-in test process (S50). Namely, based on the measurement data obtained in the probe test process (S20) performed for the wafer including the target packages (semiconductor chips), the probability of the target packages developing a degrading functional fault in a certain period of time is forecast, the probability being a test item for the burn-in test process (S50). Based on the forecast, whether the burn-in test process (S50) may be omitted is determined for each lot of the target packages.

First Embodiment

<Overall Flow>

FIG. 1 is a process flow chart outlining an example of a semiconductor device manufacturing method according to a first embodiment of the present invention. The process flow shown in FIG. 1 differs from the process flow according to an existing technique shown in FIG. 8 in that the assembly process (S30) includes sorting the assembly lots into assembly lots 21 not requiring the burn-in test process (S50) (BI-unrequired lots) and assembly lots 22 requiring the burn-in test process (S50) (BI-required lots).

The packages sorted as assembly lots (BI-required lots) 22 are subsequently processed through the package test process (S42), burn-in test process (S50) and final test process (S60) as in the process flow shown in FIG. 8. On the other hand, the packages sorted as assembly lots (BI-unrequired lots) 21 are, after being processed through a package test process (S41), sent to the final test process (S60) skipping the burn-in test process (S50). In this way, the work load and cost associated with the burn-in test process (S50) can be greatly reduced. When more packages are sorted as assembly lots (BI-unrequired lots) 21, the test cost can be reduced more.

Referring to FIG. 1, the package test processes (S41) and (S42) may be either identical to or different from the package test process (S40) shown in FIG. 8. According to the process flow shown in FIG. 1, all assembly lots are sent to a final test process (S60) regardless of whether they were processed in the burn-in test process (S50), but the assembly lots coming through the burn-in test process (S50) and other assembly lots not coming through the burn-in test process (S50) may be processed separately like in the case of the package test processes (S41) and (S42).

According to the present embodiment, burn-in necessity determination processing (S100) is performed to determine, in the assembly process (S30), whether or not the burn-in test process (S50) is required for individual assembly lots. In the assembly process (S30), an assembly device such as a die bonder receives a BI-required/unrequired chip list 50 outputted as a result of the burn-in necessity determination processing (S100). Based on the contents of the BI-required/unrequired chip list 50, i.e. based on whether or not the chips are required to be subjected to the burn-in test, the chips picked up from the wafer by an assembly device are sorted into assembly lots requiring the burn-in test (BI-required lots) 22 and assembly lots not requiring the burn-in test (BI-unrequired lots) 21.

In the burn-in necessity determination processing (S100), as being described in detail later, whether or not the burn-in test is required is determined for the individual chips tested in the probe test process (S20), and the BI-required/unrequired chip list 50 is outputted. This is done by making calculations using input measurement data 30 containing, for example, a log of measurement results and test results obtained on the respective chips in the probe test process (S20) and based on a predetermined determination model 40.

The measurement data 30 may include various data measured in the probe test process (S20). Particularly, it is desirable to use current measurement data. Hence, the present embodiment will be described based on the assumption that current measurement data is used as the measurement data 30. The current measurement data that can be obtained in probe tests includes data on, for example, leak current, reset current, active current, and IDDQ.

The reasons why it is desirable to use current measurement data in determining whether or not the burn-in test is required for chips are as follows. (1) In a current test performed in a probe test process, all circuits on each chip are supplied with current, so that the possibility of defects being overlooked is low and so that defective chips can be efficiently detected. (2) The value of current flowing through each CMOS (complementary metal-oxide semiconductor) transistor in an inactive state is very small, so that an abnormal current value can be easily detected even if it is due to a latent defect. (3) In the case of a defect related with short-circuiting which is a main cause of chip degradation, also, a large change occurs in current value, so that the defect can be easily detected. (4) The value of a reset current can be easily measured in a short test time.

Besides the current measurement data, for example, frequency measurement data and voltage measurement data are also useful. Such data may also be used as required to complement the current measurement data. The reasons why the frequency measurement data is useful are as follows. (1) Operating margin defects can be easily detected. (2) Generally, current and frequency are highly correlated, so that, by detecting their deviation from the correlationship, internal circuit defects can be detected. On the other hand, the reasons why voltage measurement data is useful are as follows. (1) Detection of factors causing variation in manufacture is easy. (2) Abnormality caused by power supply noise can be detected easily.

<Burn-In Necessity Determination Processing>

Figure 2:
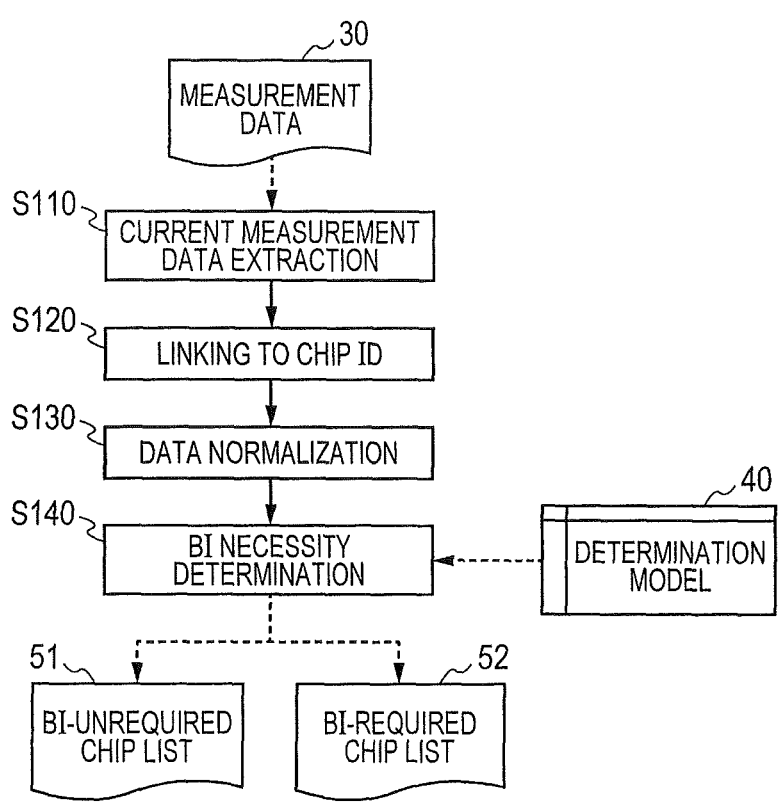
FIG. 2 is a flowchart showing an example of burn-in necessity determination processing according to the first embodiment.

FIG. 2 is a flowchart showing an example of burn-in necessity determination processing (S100) shown in FIG. 1. In the present embodiment, whether or not to perform the burn-in test process (S50) as a back-end process is determined for individual lots based on the BI required/unrequired chip list 50 outputted in the burn-in necessity determination processing (S100) as shown in FIG. 1. Therefore, the burn-in necessity determination processing (S100) plays a central role in the semiconductor device manufacturing method of the present embodiment.

First, using the measurement data 30 obtained as measurement results in the probe test process (S20) as input data, data items required for determining whether the burn-in is required are extracted (S110). As stated in the foregoing, in the present embodiment, mainly current measurement data is extracted. Next, the current measurement data extracted is linked to unique ID information (chip IDs) allocated to individual chips (S120). This makes it possible to grasp current measurement data using chip IDs as keys.

Subsequently, the current measurement data is normalized as required using a method generally used for statistical processing (S130). Next, by making calculations using the normalized data and based on the determination model 40 for determining whether or not to perform the burn-in, whether or not to perform the burn-in test is determined for individual chips (S140). The determination results are outputted as a BI-unrequired chip list 51 listing chips not requiring the burn-in test to be performed and a BI-required chip list 52 listing chips requiring the burn-in test to be performed. In FIG. 1, these lists are denoted as the BI-required/unrequired chip list 50.

The burn-in necessity determination processing described above can be performed, for example, by a software program installed in a manufacturing device or inspection device used in a front-end process. Alternatively, it may be performed by a software program run on an independent information processing device, for example, a PC (personal computer).

The determination model 40 used for determination calculations performed in step S140 is set in advance of step S140 and is represented, for example, by a predetermined numerical expression which includes parameters and variables representing current values extracted from current measurement data. The determination model 40 is for, based on the measurement data 30 obtained as measurement results in the probe test, predicting chips to fail in the burn-in test (hereinafter also referred to as "BI failing chips" and listing the BI failing chips in the BI-required chip list 52 while listing the other chips unlikely to fail in the burn-in test in the BI-unrequired chip list 51. In the following, how to generate a determination model 40 will be described.

<Determination Model Generation by Learning>

How to generate and define a determination model 40 is not particularly limited. For the present embodiment, the determination model 40 is assumed to be generated by so-called mechanical learning or data mining using accumulated test result data on chips and lots manufactured in the past as learning data. Various methods of mechanical learning and data mining are generally known. For the present embodiment, the method to be used is not particularly limited and various methods may be appropriately used.

In the present embodiment, the measurement data 30 obtained in the probe test performed in a front-end process on the chips that actually failed in the burn-in test performed in a later back-end process is analyzed to find any tendency shown by the measurement data 30 on such chips and, out of the test items of the probe test, those showing correlationship with the chips that failed in the burn-in test are extracted. A numerical expression is then generated which includes parameters and variables representing measurement data of the extracted test items, for example, measured current values. The numerical expression thus generated is used as a determination model 40.

Figure 3:
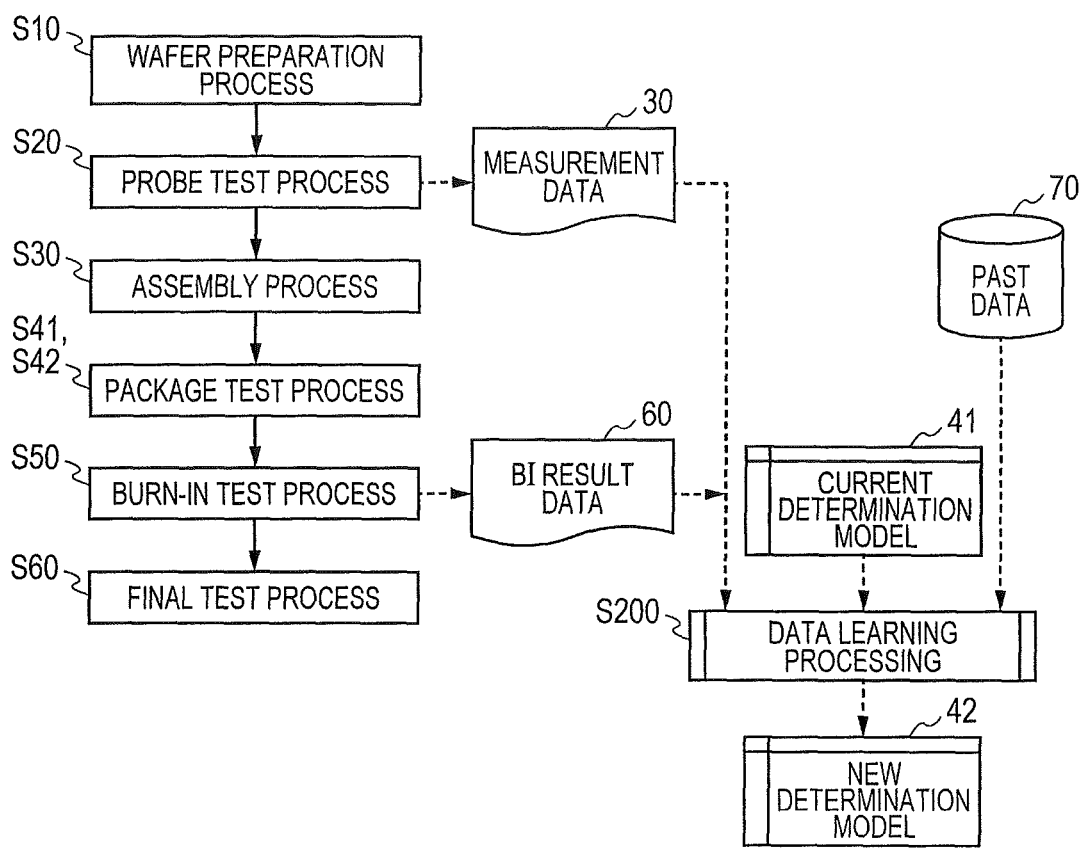
FIG. 3 is a process flowchart outlining an example overall flow of learning processing for generating a determination model according to the first embodiment.

FIG. 3 is a process flowchart outlining an example overall flow of learning processing for generating a determination model 40. Steps S10 to S60 shown in FIG. 3 correspond to steps S10 to S60 shown in FIG. 1, so that their description will not be repeated here. In the learning processing shown in FIG. 3, measurement data 30 representing measurement results obtained in the probe test process (S20) and BI result data 60 representing test results obtained in the burn-in test process (S50) are also inputted as learning data, and data learning processing (S200) is performed to generate a new determination model 42, i.e. a new version of the determination model 40, out of a current determination model 41, i.e. a current version of the determination model 40.

As described above, in addition to the measurement data 30 generated from the latest test results and the BI result data 60, past data 70 generated from various accumulated test results on chips manufactured in the past is also inputted as the learning data. Namely, when chips are manufactured and new measurement data 30 and BI result data 60 are obtained, the past data 70 is added to the new data and, using the total data thus obtained as learning data, the data learning processing (S200) is performed. By repeating this process, the current determination model 41 can be gradually improved to be the new determination model 42. Therefore, the data learning processing (S200) may be performed, for example, every time new measurement data 30 and BI result data 60 are obtained or periodically using the measurement data 30 and BI result data 60 accumulated during the last period.

Figure 4:
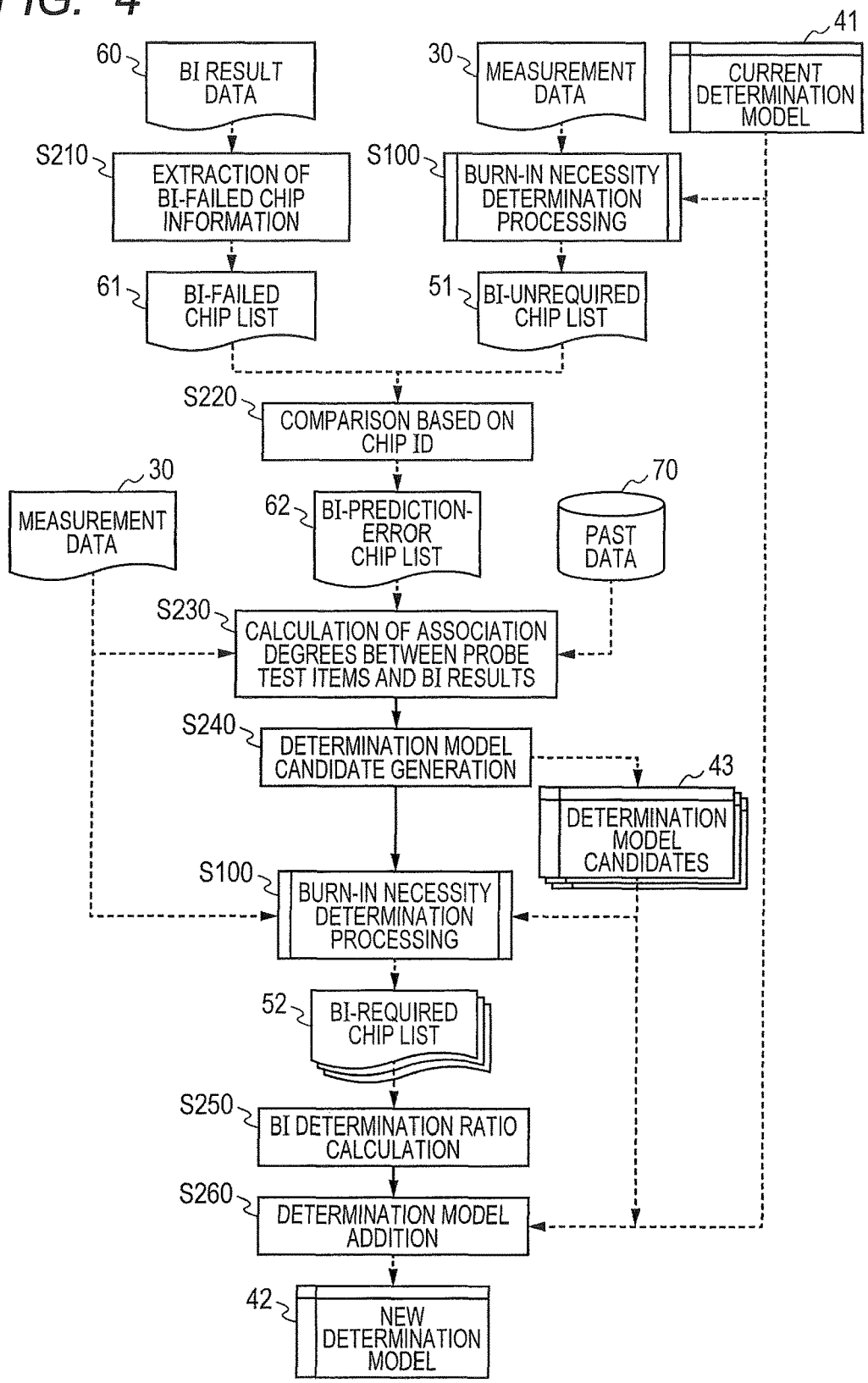
FIG. 4 is a flowchart outlining an example of the data learning processing according to the first embodiment.

FIG. 4 is a flowchart outlining an example of the data learning processing (S200) shown in FIG. 3. First, using the measurement data 30 representing the measurement results obtained by performing a probe test and the current determination model 41, the burn-in necessity determination processing (S100) shown in FIG. 2 is performed, and the BI-unrequired chip list 51 containing information on chips determined not to require the burn-in test is obtained. Also, from the BI result data 60 representing the results of an actually performed burn-in test, information on the chips that failed the burn-in test, i.e. the chips for which the burn-in test could not be omitted, is extracted, and a BI-failed chip list 61 listing the chips is outputted (S210).

Subsequently, the BI-unrequired chip list 51 and the BI-failed chip list 61 are compared based on chip IDs to detect chips listed in both the BI-unrequired chip list 51 and the BI-failed chip list 61, and a BI-prediction-error chip list 62 listing the detected chips is outputted (S220). Namely, the BI-prediction-error chip list lists the chips that failed the burn-in test (the chips that actually required the burn-in test to be performed) even though they were earlier determined, in the burn-in necessity determination processing (S100) performed using the current determination model 41, not to require the burn-in test. Thus, a new determination model 42 to be generated is required to be one which can determine chips like those detected as described above as requiring the burn-in test.

To generate a new determination model 42, first, using a predetermined method, the degrees of association between the values of various test items recorded in the measurement data 30 and past data 70 and the burn-in test results are calculated (S230). If any test item used in the probe test indicates a large difference in data tendency between chips which failed a later burn-in test and chips which passed the later burn-in test, the test item can be determined as being closely associated with the burn-in test results (as to whether or not each chip failed the burn-in test). Such a test item is suitable for use in predicting the burn-in test result on each chip.

To calculate the degree of association between the probe test items and burn-in test results, various statistical methods such as Chi-square test can be appropriately used. FIGS. 5A to 5F show calculated examples of degrees of association between various test items measured in a probe test and burn-in test results. Each of FIGS. 5A to 5F shows two data distribution curves for a test item in a probe test with the curve having a higher peak representing the distribution of data on chips having passed a burn-in test and with the curve having a lower peak representing the distribution of data on chips having failed the burn-in test. Below each of FIGS. 5A to 5F, a Chi-square value calculated as an indicator of the degree of difference between the two data distribution curves is indicated.

FIG. 5A, for example, shows example data distribution curves for test item "t11" concerning leak current. In this case, the data distribution curve representing chips having passed a burn-in test and the data distribution curve representing chips having failed the burn-in test have peaks differing in height, but their peaks are almost identically positioned. Thus, the degree of difference between the two data distributions is low (the degree of matching between them is high). The Chi-square value in this case is small (3.7 in the example shown in FIG. 5A). Therefore, test item "t11" concerning leak current is low in the degree of association with burn-in test results (data distribution tendency is not much different between the two data distributions). Thus, test item "t11" is not adopted as a model for determining whether or not the burn-in test is required.

FIG. 5B, on the other hand, shows example data distribution curves for test item "t21" concerning reset current. In this case unlike in the case of the example shown in FIG. 5A, the data distribution curve representing chips having failed a burn-in test has a peak largely shifted to the right relative to the peak of the data distribution curve representing chips having passed the burn-in test. Thus, the degree of difference between the two data distributions is high. The Chi-square value in this case is large (14807 in the example shown in FIG. 5B). Therefore, test item "t21" concerning reset current is high in the degree of association with burn-in test results (data distribution tendency is largely different between the two data distributions). Thus, test item "t21" is adopted as a model for determining whether or not the burn-in test is required.

For the other test items, also, the Chi-square value is calculated for the data distributions for chips having passed a burn-in test and chips having failed the burn-in test. Then, each test item with the corresponding Chi-square value larger than a predetermined value is determined to be high in the degree of association with burn-in test results and is adopted as a model for determining whether or not the burn-in test is required.

Reverting to FIG. 4, when plural test items are adopted in step S230, based on the test items, a candidate for a determination model for determining whether or not the burn-in test is required for each chip is generated (S240). When three or more test items are adopted in step S230, it is generally difficult to generate a model to be a criterion for determination based on the three or more test items. Even such multidimensional cases in terms of test items can be converted into two-dimensional cases by using a general statistical method, for example, principal component analysis.

Figure 6:
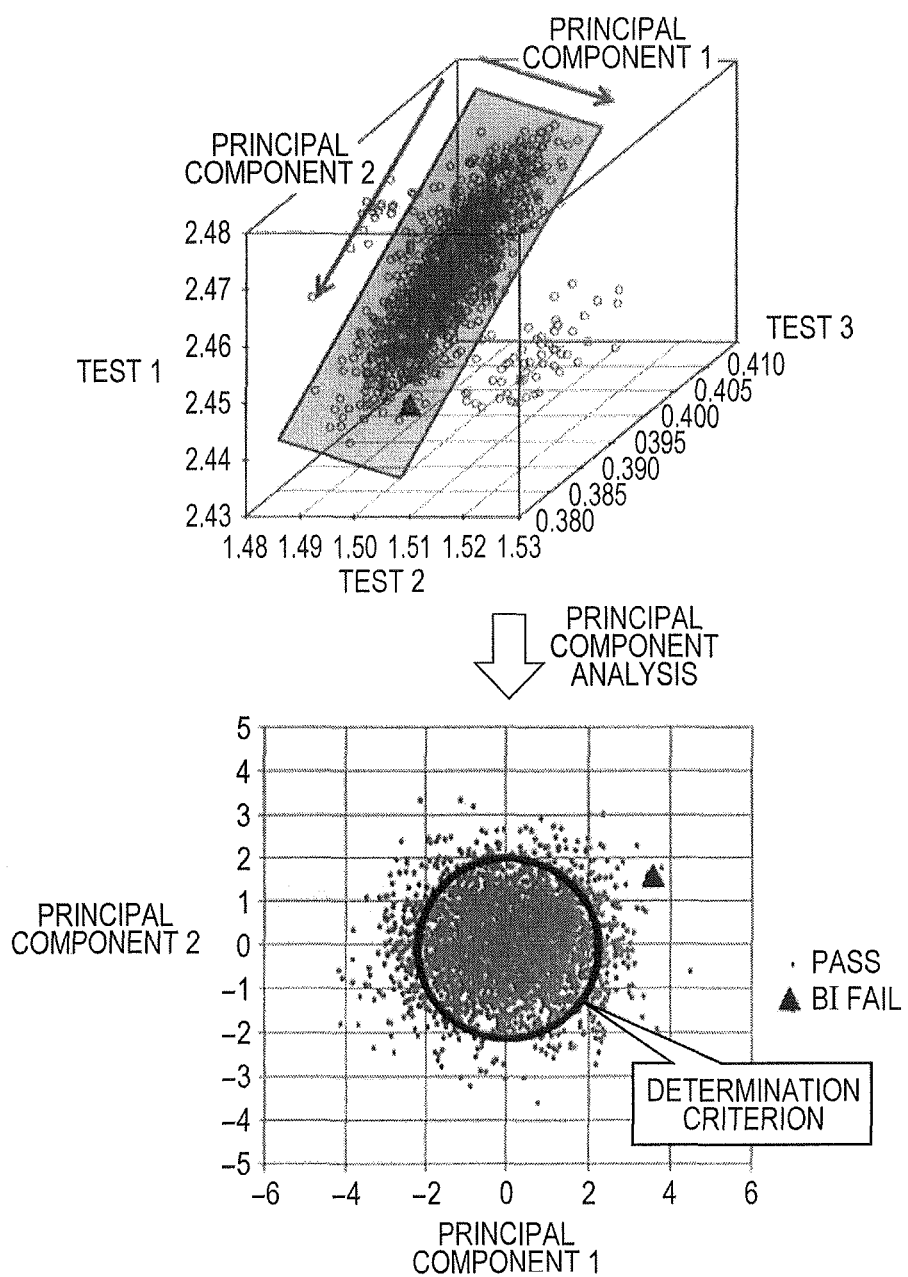
FIG. 6 is a diagram outlining an example of determination model generation based on plural test items.

FIG. 6 is a diagram outlining an example of determination model generation based on plural test items. The upper part of FIG. 6 three-dimensionally represents data distributions for individual chips subjected to tests 1 to 3 in a probe test. If the number of test items increases to four, representing data distributions becomes difficult. In such a situation, it is difficult to set a model to be a criterion for determination.

Using a general principal component analysis method makes it possible to convert multidimensional data into two-dimensional data composed of principal component 1 and principal component 2 as shown in the lower part of FIG. 6. For the two-dimensional data, a determination criterion can be easily visually set, for example, like a circle shown in the lower part of FIG. 6 for use as a criterion for rejecting the chips like those that failed in a burn-in test (chips represented by the triangle mark in FIG. 6). It is then possible to generate a numerical expression to represent such a criterion and use the numerical expression as a determination model. In this case, chips with data generated on the target test items coming inside the determination criterion circle are determined not to require the burn-in test and chips with data generated on the target test items coming outside the determination criterion circle are subjected to the burn-in test. In this way, chips likely to fail in the burn-in test can be prevented from being shipped.

When plural test items are adopted in step S230 shown in FIG. 4, by performing the principal component analysis described above for each of different test item combinations, plural determination models can be generated. The plural determination models are outputted as determination model candidates 43 in step S240.

Subsequently, out of the determination model candidates 43, one with high capability to determine chips requiring a burn-in test (with high accuracy and efficiency) is selected. In the present embodiment, a BI determination ratio is calculated for each determination model candidate 43 by the following method and, based on the calculated BI determination ratios, one of the determination model candidates is selected.

First, as shown in FIG. 4, the burn-in necessity determination processing (S100) shown in FIG. 2 is again performed using each determination model candidate 43 and, thereby, a BI-required chip list 52 containing information about chips determined to require a burn-in test is obtained. Furthermore, the BI determination ratio is calculated for each determination model candidate 43 based on the BI-required chip list 52 (S250). The BI determination ratio of each determination model candidate 43 represents the ratio of the chips that can be determined, based on the determination model candidate 43, to require a burn-in test to all chips. Namely, it is calculated by dividing the number of chips listed as requiring a burn-in test in the BI-required chip list 52 generated using a target determination model candidate 43 by the total number of chips.

Subsequently, a determination model candidate 43 with the highest BI determination ratio is selected, the selected determination model candidate 43 is added to the current determination model 41, and the current determination model 41 added to by the selected determination model candidate 43 is outputted as a new determination model 42 (S260). This is how a new determination model 42 is generated.

In the process flow shown in FIG. 4, a BI-prediction-error chip list 62 listing, as burn-in test results, chips which, though not determined to require a burn-in test based on the current determination model 41, failed a later burn-in test is inputted in step S230. Alternatively, instead of the BI-prediction-error chip list 62, a BI-failed chip list 61 listing all chips which failed the burn-in test may be inputted. In this case, in step S260, the new determination model candidate 43 is not added, as a difference addition, to the current determination model 41, but it entirely replaces the current determination model 41.

As described above, according to the semiconductor device manufacturing method of the first embodiment, whether or not individual packages will require a burn-in test process (whether or not the process is omissible) is determined based on measurement results obtained in a probe test process performed as a front-end process, and the burn-in test in a back-end process is omitted for the lots including no packages determined to require a burn-in test (the process not omissible). In this way, the cost of the burn-in test can be greatly reduced.

Second Embodiment

Figure 7:
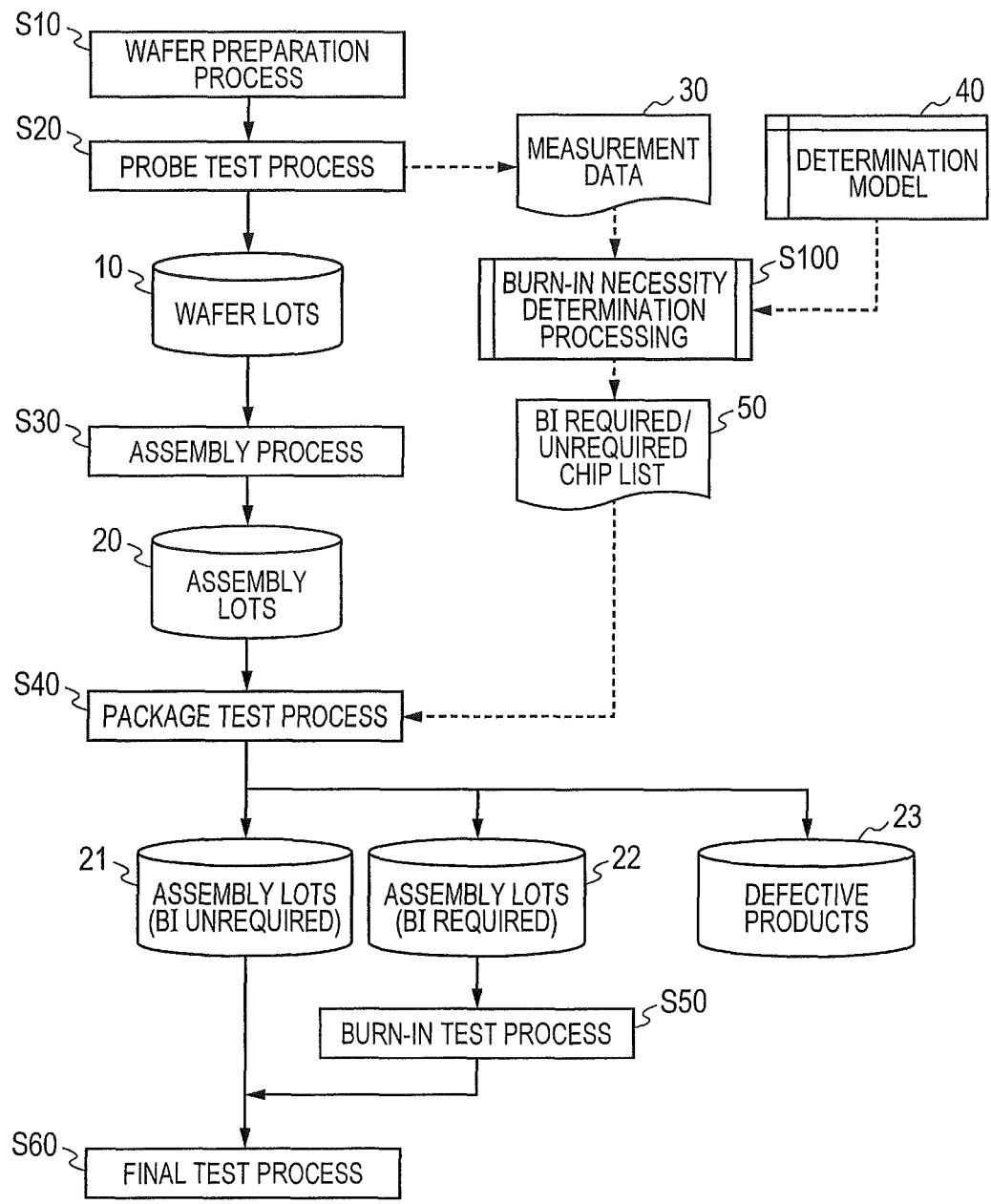
FIG. 7 is a process flow chart outlining an example of a semiconductor device manufacturing method according to a second embodiment of the present invention.

FIG. 7 is a process flow chart outlining an example of a semiconductor device manufacturing method according to a second embodiment of the present invention. In the second embodiment unlike in the process flow of the first embodiment shown in FIG. 1, whether or not the burn-in test process (S50) is required for each assembly lot 20 is determined not in the assembly process (S30) but in the package test process (S40). In this way compared with the process flow of the first embodiment, the assembly process (S30) can be kept as simple as in existing methods. In the process flow of the first embodiment shown in FIG. 1, the chips formed on wafers are sorted, before being separated by dicing, into lots requiring a burn-in test and other lots requiring no burn-in test to be then managed as sorted lots. This can complicate the subsequent assembly process (S30). There are, however, cases in which, depending on the product to be manufactured, no package test processes (S40, S41, S42) are performed. An advantage to the process flow of the first embodiment is that it is applicable even in such cases.

In the process flow of the present embodiment shown in FIG. 7, the processes up to the assembly process (S30) are the same as in the existing process flow shown in FIG. 8, and the assembly lots 20 includes both those lots requiring a burn-in test and other lots requiring no burn-in test. In the package test process (S40), the assembly lots 20 after being tested are sorted into defective products 23, assembly lots requiring no burn-in test (BI-unrequired lots) 21, and assembly lots requiring a burn-in test (BI-required lots) 22 based on the BI-required/unrequired chip list 50 generated in the burn-in necessity determination processing (S100).

In concrete terms, for example, a testing device to perform a package test tests individual chips (packages) and sorts the chips that failed the test as defective products 23 and discards them. Also, out of the chips that passed the test, those chips listed, in the BI-required/unrequired chip list 50, as requiring no burn-in test are sorted into the assembly lots (BI-unrequired lots) 21 and other chips listed as requiring a burn-in test are sorted into the assembly lots (BI-required lots) 22.

The subsequent burn-in test process (S50) is performed only for the assembly lots (BI-required lots) 22 sorted as lots requiring a burn-in test. Subsequently, the final test process (S60) is performed. In the present embodiment, also, like in the process flow shown in FIG. 1 for the first embodiment, all assembly lots excluding the defective products 23 are sent to the final test process (S60) regardless of whether they were processed in the burn-in test process (S50), but the assembly lots coming through the burn-in test process (S50) and other assembly lots not coming through the burn-in test process (S50) may be sent to separate processes.

The burn-in necessity determination processing (S100) is the same as that shown in FIG. 1 for the first embodiment and the data learning processing (S200) included in the burn-in necessity determination processing (S100) is also the same as that shown in FIG. 3 and FIG. 4, so that its description will not be repeated here.

As described above, according to the semiconductor device manufacturing method of the second embodiment, it is possible, while keeping the assembly process as simple as in existing semiconductor device manufacturing methods, to determine for packages whether or not a burn-in test process is required (whether or not the burn-in test process is omissible) using the measurement results obtained in a probe test process performed as a front-end process and to omit the burn-in test process included in a back-end process for package lots including no packages determined to require a burn-in test process (the burn-in test process is not omissible). This can greatly reduce the cost of the burn-in test.

The invention made by the present inventors has been described based on exemplary embodiments, but the invention is not limited to the above embodiments and can be modified in various ways without departing from the scope of the invention.

What is claimed is:

1. A semiconductor device manufacturing method, comprising:
   (a) forming a plurality of semiconductor chips on a main surface of a semiconductor wafer;
   (b) electrically testing each of the semiconductor chips;
   (c) dicing the semiconductor wafer into individual semiconductor chips and assembling each of the semiconductor chips into a package to be a semiconductor device;
   (d) subjecting the packages to a burn-in test;
   (e) based on first and second measurement data obtained in step (b), determining whether each of the semiconductor chips requires the burn-in test to be performed; and
   (f) based on a first measurement data which passed the electrical testing in step (b) and results of the burn-in test performed in step (d) concerning semiconductor devices manufactured in the past, generating a determination model for determining, based on the first measurement data obtained in step (b) on the semiconductor chips, whether the semiconductor chips require the burn-in test to be performed,
   wherein, in step (c), the packages assembled with the semiconductor chips, respectively, are sorted into a first lot including, out of the semiconductor chips, those semiconductor chips determined in step (e) to require the burn-in test to be performed and a second lot including, out of the semiconductor chips, those semiconductor chips determined in step (e) not to require the burn-in test to be performed, and
   wherein, instep (d), only the packages included in the first lot are subjected to the burn-in test, and
   wherein, in step (e), whether each of the semiconductor chips requires the burn-in test to be performed is determined using the determination model and based on the first measurement data obtained in step (b).

2. The semiconductor device manufacturing method according to claim 1,
   wherein the measurement data used in step (e) is measurement data obtained in a current-related test performed in step (b).

3. The semiconductor device manufacturing method according to claim 1,
   wherein the measurement data used in step (f) is measurement data obtained in a frequency-related test performed in step (b).

4. The semiconductor device manufacturing method according to claim 1,
   wherein the measurement data used in step (f) is measurement data obtained in a voltage-related test performed in step (b).

5. A semiconductor device manufacturing method, comprising:
   (a) forming a plurality of semiconductor chips on a main surface of a semiconductor wafer;
   (b) electrically testing each of the semiconductor chips;
   (c) dicing the semiconductor wafer into individual semiconductor chips and assembling each of the semiconductor chips into a package to be a semiconductor device;
   (d) electrically testing the packages;
   (e) subjecting the packages to a burn-in test;
   (f) based on first and second measurement data obtained in step (b), determining whether each of the semiconductor chips requires the burn-in test to be performed; and
   (g) based on first measurement data which passed the electrical testing in step (b) and results of the burn-in test performed in step (e) concerning semiconductor devices manufactured in the past, generating a determination model for determining, based on the first and second measurement data obtained in step (b) on the semiconductor chips, whether the semiconductor chips require the burn-in test to be performed,
   wherein, in step (d), the packages are, after being electrically tested, sorted into a first lot including, out of the packages, those packages each including a semiconductor chip determined in step (f) to require the burn-in test to be performed and a second lot including, out of the packages, those packages determined in step (f) not to require the burn-in test to be performed,
   wherein, instep (e), only the packages included in the first lot are subjected to the burn-in test, and
   wherein, in step (f), whether each of the semiconductor chips requires the burn-in test to be performed is determined using the determination model and based on the first measurement data obtained in step (b).

6. The semiconductor device manufacturing method according to claim 5,
   wherein the measurement data used in step (f) is measurement data obtained in a current-related test performed in step (b).

7. The semiconductor device manufacturing method according to claim 5,
   wherein the measurement data used in step (f) is measurement data obtained in a frequency-related test performed in step (b).

8. The semiconductor device manufacturing method according to claim 5,
   wherein the measurement data used in step (f) is measurement data obtained in a voltage-related test performed in step (b).

* * * * *